United States Patent
Allen et al.

(10) Patent No.: US 7,340,717 B2
(45) Date of Patent: Mar. 4, 2008

(54) METHOD FOR PROVIDING ENHANCED DYNAMIC SYSTEM SIMULATION CAPABILITY OUTSIDE THE ORIGINAL MODELING ENVIRONMENT

(75) Inventors: Richard Craig Allen, Union City, CA (US); Randy A Coverstone, Newark, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 581 days.

(21) Appl. No.: 10/253,764

(22) Filed: Sep. 24, 2002

(65) Prior Publication Data

US 2004/0059556 A1    Mar. 25, 2004

(51) Int. Cl.
    G06F 9/44    (2006.01)
(52) U.S. Cl. ..................................... 717/106
(58) Field of Classification Search ............... 717/100, 717/101, 102, 104, 106, 107, 115, 108, 111, 717/134, 135; 709/203, 205, 219, 223, 224; 707/9, 10, 100, 103; 703/23, 15; 714/38; 718/102, 104; 705/110; 700/131
    See application file for complete search history.

(56) References Cited

U.S. PATENT DOCUMENTS

| | | | | |
|---|---|---|---|---|
| 6,762 | A * | 10/1849 | Stewart et al. ................ 188/47 |
| 79,199 | A * | 6/1868 | Barsness et al. ............ 210/538 |
| 5,287,511 | A * | 2/1994 | Robinson et al. ........... 717/106 |
| 5,546,562 | A * | 8/1996 | Patel .......................... 703/14 |
| 5,572,437 | A * | 11/1996 | Rostoker et al. ............. 716/18 |
| 5,933,356 | A * | 8/1999 | Rostoker et al. ............. 703/15 |
| 6,038,393 | A * | 3/2000 | Iyengar et al. .............. 717/104 |
| 6,053,951 | A * | 4/2000 | McDonald et al. ......... 717/109 |
| 6,144,377 | A * | 11/2000 | Oppermann et al. ........ 715/744 |
| 6,167,564 | A * | 12/2000 | Fontana et al. ............. 717/104 |
| 6,327,509 | B1 * | 12/2001 | Ashida ......................... 700/5 |
| 6,405,364 | B1 * | 6/2002 | Bowman-Amuah ......... 717/101 |
| 6,557,164 | B1 * | 4/2003 | Faustini ...................... 717/107 |
| 6,629,123 | B1 * | 9/2003 | Hunt ........................... 718/106 |
| 6,871,346 | B1 * | 3/2005 | Kumbalimutt et al. ...... 718/104 |
| 2004/0044988 | A1 * | 3/2004 | Schene ........................ 717/106 |

OTHER PUBLICATIONS

Edouard Bugnion, "Disco: Running Commodity Operationg Systems on Scalable Multiprocessors", Nov. 1997, ACM Press, ACM TOCS, vol. 15, Issue 4, pp. 1-36.*

(Continued)

*Primary Examiner*—Wei Zhen
*Assistant Examiner*—Anna Deng

(57) ABSTRACT

A method for generating a software model of a dynamic system takes as input a preliminary software model of the system. Normally, the preliminary software model is based on a system model that is generated by a system designer within a modeling environment. Generally speaking, the preliminary software model does not allow access to the internal variables of the system model from outside the modeling environment, but nonetheless may be executed on a computer platform in the absence of the modeling environment. Interface software is then produced which exposes the internal variables of the system model. The resulting software model, built from both the preliminary software model and the interface software, allows programmatic access to its internal variables, and potentially allows execution control, from outside the modeling environment, thus typically enhancing detailed simulation of the system model beyond the capabilities provided by the modeling environment.

22 Claims, 4 Drawing Sheets

OTHER PUBLICATIONS

Nirav H. Kapadia, el at., "The Purdue University Network-Computing Hubs: Running Unmodified Simulation Tools via the WWW", Jan. 2000, ACM Press, ACM TOMACS, vol. 10, Issue 1, p. 1-19.*

A.M. Uhrmacher, "Dynamic Structuress in Modeling and Simulation: A Reflective Approach", ACM Press, Apr. 2001, TOMACS vol. 11 Issue 2, pp. 206-232.*

Ronald Fagin et al. "Extendible Hashing—A Fast Access Method for Dynamic Files", ACM Press, Sep. 1979, TODS, vol. 4, No. 3, pp. 315-344.*

* cited by examiner

METHOD FOR PROVIDING ENHANCED DYNAMIC SYSTEM SIMULATION CAPABILITY OUTSIDE THE ORIGINAL MODELING ENVIRONMENT

BACKGROUND OF THE INVENTION

Dynamic systems, which are human-devised systems that respond in some beneficial way to changing conditions within their environment, represent a significant challenge to the designers of such systems due to the myriad and diverse conditions such systems must be capable of handling effectively. For example, electrical and electronic circuits, which represent but one type of dynamic system, often must react to ever-changing input signals by providing output signals based on the input signals, thereby causing some favorable action in the environment in which the system operates. Electrical and electronic circuits are utilized to great advantage in a plethora of applications, from everyday consumer appliances, such as microwave ovens and personal computers, to high-tech military weaponry. Additionally, dynamic systems also include any type of software written to perform a specific, useful function. Furthermore, dynamic systems may include, but are not limited to, those based on electrical, software, mechanical, pneumatic, or chemical principles, or some combination thereof.

The task of designing dynamic systems has been greatly enhanced by continual improvements in the technology of system simulation. Such simulation allows models of dynamic system designs to be tested initially without the need of expensive prototypes that are difficult to both build and maintain. Through simulation, any imaginable set of test conditions may be employed to thoroughly exercise a preliminary system design. The results of those tests may then by used by the system designer to analyze the performance of the system. Typically, changes are then made based on the results of the tests, the tests are rerun, and the results are analyzed once again to determine the positive or negative effect of the changes. Thus, simulation allows the design of the dynamic system to be improved by way of an iterative process prior to the actual construction of the system under test, resulting in faster and more productive system development.

A specific example of such a modeling environment is the Simulink® system definition and simulation tool by The Mathworks, Inc. As shown in FIG. 2, a modeling environment 210 allows a system designer to specify a dynamic system, whether it is electrical, mechanical or otherwise, by way of a system model 1 possessing characteristics as determined by the designer. An example of the system model 1 is shown in FIG. 1. The system model 1 consists of several functional blocks 2, each of which performs some identifiable task within the system model 1. Ordinarily, one or more input signals 3 and output signals 4 (or, external variables, collectively) are utilized by the dynamic system represented by the model 1 to communicate with and influence the surrounding environment. Each block 2 may have associated with it one or more block parameters 5 that influence how the functional block 2 performs its particular function. Additionally, internal signals 6 of the system model 1 allow the functional blocks 2 to communicate, thereby allowing cooperation among the functional blocks 2 to perform the overall function of the dynamic system. Most modeling environments 210, such as Simulink, also allow hierarchical design, as each block 2 of the system model 1 may further consist of sub-blocks (not shown) representing various functions within the associated higher-level block 2.

As seen in FIG. 2, the system model 1 specified in the Simulink environment may then be simulated within that same environment using input signals 3 devised by the system designer. The analysis, subsequent design changes, and further simulation of the model normally all occur within the purview of the Simulink tool. To enhance this process, Simulink allows access to the internal signals 6, block parameters 5, and other important internal variables of the system model 1 that define the behavior of the proposed system. The internal signals 6 allow the designer more insight into the operations of the system model, while modification of the parameter blocks 5 provide a method by which the designer may alter the operation of the model 1 during simulation. Thus, access to these internal variables makes the entire simulation and analysis process more efficient.

A related code-generation tool 220, such as that provided by The Mathworks, called the Real-Time Workshop® (RTW), takes system models originally developed within the modeling environment 210 as input, and generates code, or software, representing the system model (230 of FIG. 2). The code 230 can be generated in one of several different programming languages, including C, Ada, and others. This code 230 may then be transferred to and executed on another platform, with the execution of the code 230 possibly progressing in real-time, depending on the nature of the platform. In the case of electronic control systems, the platform may be the target platform ultimately used to implement the control system, thus providing a nearly seamless progression from system model generation to production-level code.

Unfortunately, the system internal variables, such as the internal signals 6 and block parameters 5 of FIG. 1, that are initially accessible in the simulation environment 210 are often no longer accessible on the platform executing the model code 230 without additional model-specific software that has been specially created by the designer. In an effort to remedy this situation within the Mathworks environment, the RTW tool provides an "external mode" option, which allows the designer access to the internal variables of the RTW-generated code when accessed via the Simulink environment. In using external mode, such internal variable access via Simulink is possible whether the RTW-generated code is executed on the same platform which is executing Simulink, or on another platform which is connected to the Simulink platform by way of a communications link, such as Transmission Control Protocol/Internet Protocol (TCP/IP). However, in either case, control of the simulation is still completely vested within the Simulink modeling environment. As a result, the ability to execute the RTW-generated code, as well as to access, and possibly change, the internal variables of that code running on a separate platform is dependent upon the capabilities of Simulink, as well as the availability of a communications connection between the Simulink platform and the platform hosting the RTW-generated code. In other words, the ability to access the internal variables of an executing software model, as well as possibly control the execution of the software model in such cases, by way of a software client residing outside the original modeling environment is currently not available.

Therefore, from the foregoing, methods that automatically allow a software client outside the original modeling environment the ability to access the internal variables of a software model, as well as possibly to control the execution of a software model, would be advantageous. Such methods would allow the system designer greater flexibility in the type and extent of execution of and access to the software model available in the absence of the original modeling environment.

SUMMARY OF THE INVENTION

Embodiments of the present invention, to be discussed in detail below, represent a method for generating a software model of a dynamic system from a preliminary software model. Normally, a system model that is specified within a modeling environment is utilized to generate the preliminary software model representing the actions of the system model. The preliminary software model is executable outside of the modeling environment used to generate the original software model, but the internal variables of the model typically are not accessible by a software client that is not associated with the modeling environment.

To alleviate this situation, according to embodiments of the invention, interface software is produced which exposes at least one of the internal variables of the preliminary software model. The software model is then built from the preliminary software model and the interface software. This resulting software model thus allows programmatic access to the internal variables, and possibly allows control of the execution of the software model, from outside the modeling environment.

Such a software model allows detailed simulation and analysis of software models representing dynamic systems by way of software clients with potentially greater simulation and analysis capabilities than what would be available within the original modeling environment. Furthermore, with model execution control allowed, such a software client would be able to control the execution of multiple software models, allowing those software models to interact with each other via the software client. Additionally, software models employing such a programmatic interface could be generated through the use of disparate, incompatible modeling environments, and yet these software models would be able to interact with each other by way of the software client.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Embodiments of the invention, as described in detail below, utilize as a starting point a software model (termed a preliminary software model, below) generated within the Mathworks Simulink® modeling environment. Additionally, the following embodiments reside as software that is integrated within the Mathworks Real-Time Workshop® (RTW) code-generation tool environment to generate code with enhanced capability over that which is normally attainable within RTW. However, other simulation models and corresponding development tool environments may be employed in a similar fashion as the basis for alternate embodiments of the present invention.

Furthermore, the software of alternate embodiments of the invention may be manifested in varying levels of integration with the associated modeling environment. For example, alternate embodiments may include distinct follow-on software that is installed separately from the code generation tool. Other embodiments, like those specifically discussed herein, may involve software developed independently from the code-generation tool, but integrated within the code generation tool as one of several language targets offered by the tool. Also, other embodiments may represent code that is highly integrated within the code-generation tool to the point that such code is indistinguishable by an outside observer from that which comprises the remainder of the tool.

Figure 1:
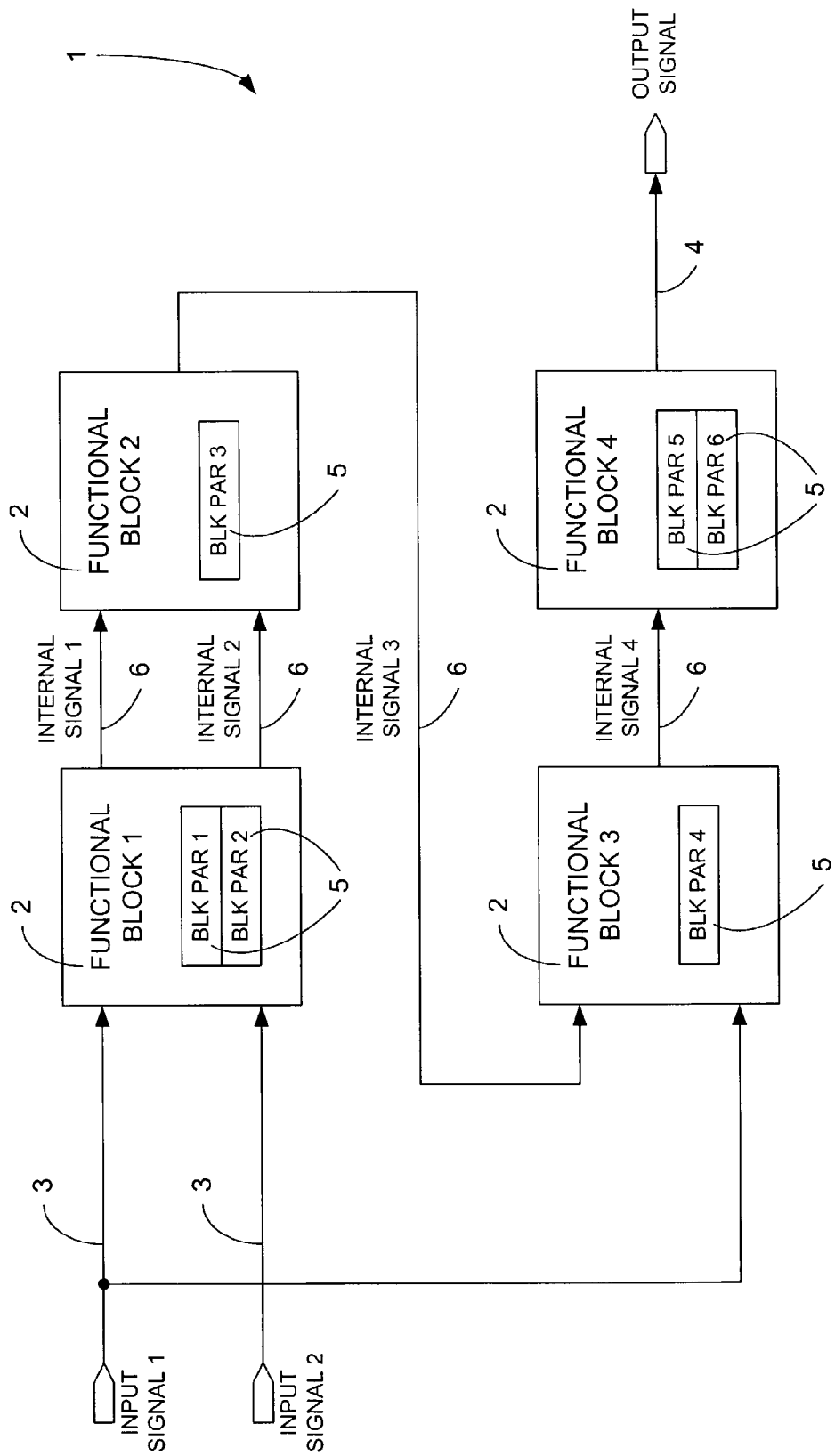
FIG. 1 is a block diagram of a system model that may be represented within the Simulink modeling environment, as well as other modeling environments.
Figure 2:
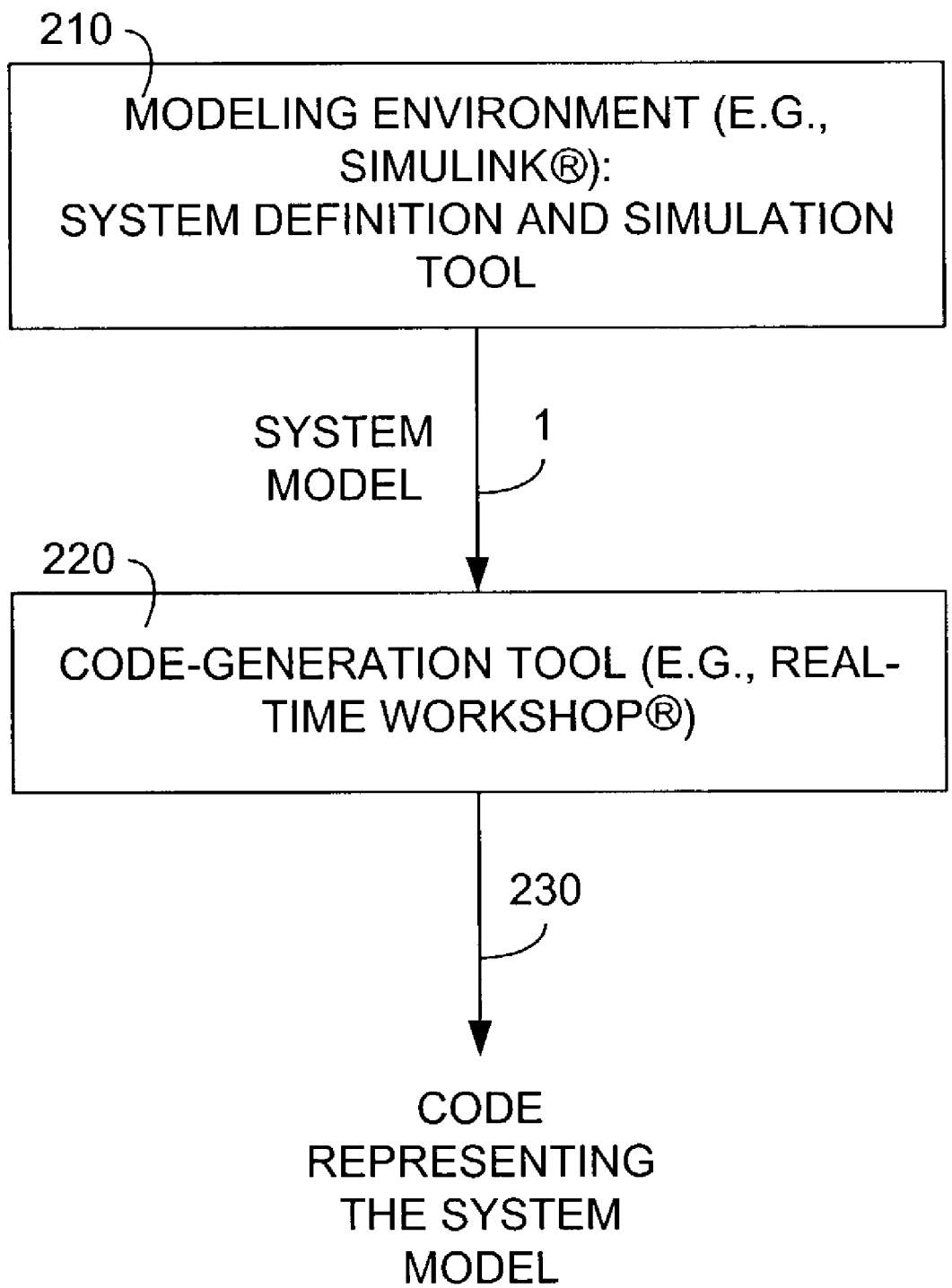
FIG. 2 is a flow chart of a method from the prior art of developing software representing a model of a dynamic system.
Figure 3:
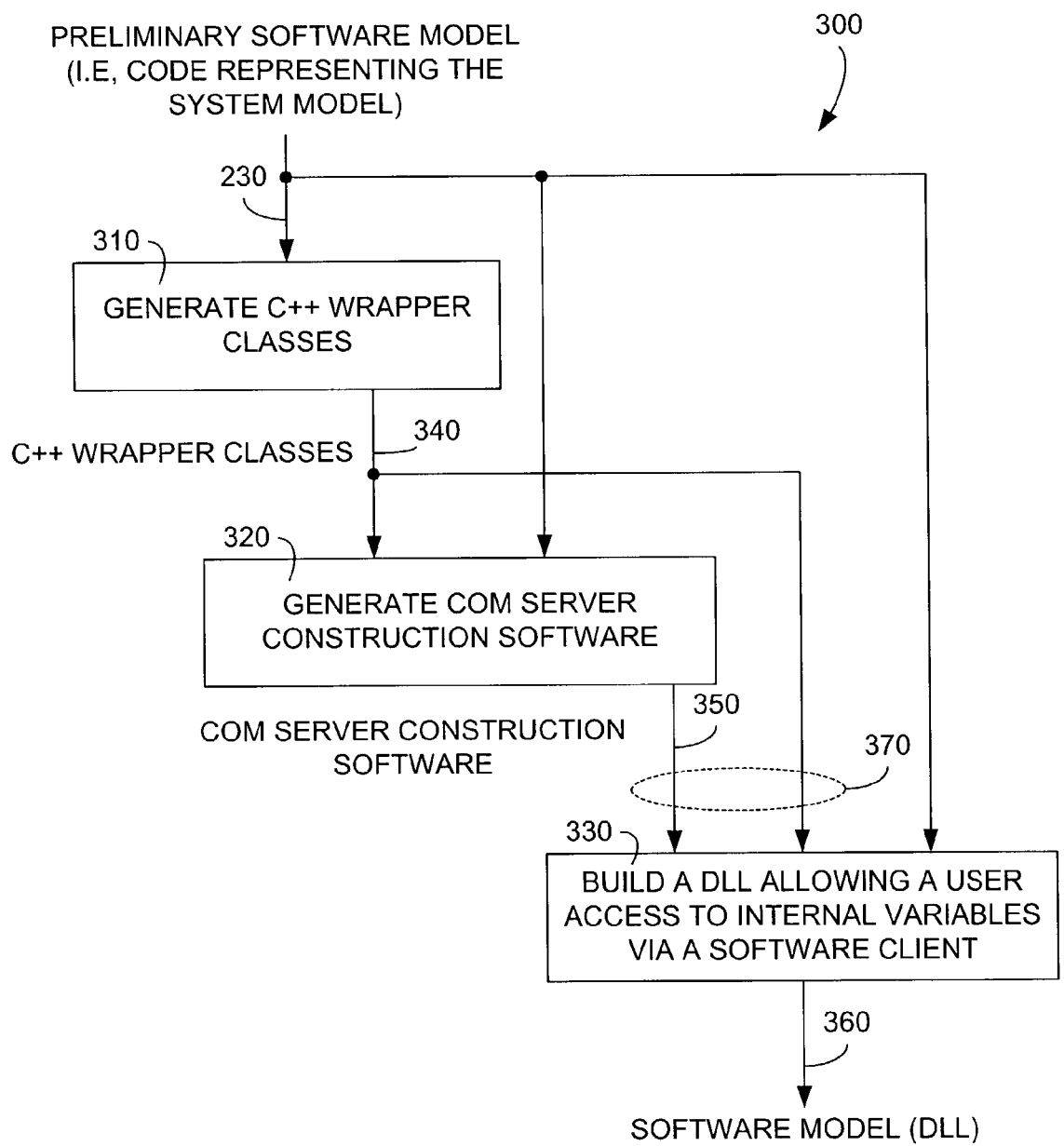
FIG. 3 is a flow chart of a method according to an embodiment of the invention of developing a software model of a dynamic system.

FIG. 3 displays a flow chart representing an embodiment of a method 300 of the present invention. Received as input by the method 300 is a preliminary software model 230, which may be, for example, the code 230 produced by the code-generation tool 220, such as RTW, as shown in FIG. 2. The preliminary software model 230 is derived from a system model 1 generated within the modeling environment 210, also from FIG. 2. As a result, the code-generation tool 220, either by itself or in combination with the modeling environment 210, may be included in alternate embodiments of the present invention.

As stated above, the preliminary software model 230 is capable of performing the functions described in the original system model. Depending on the embodiment, the target programming language used to implement the preliminary software model 230 may be C, Ada, or any other programming language, including object-oriented programming languages, such as C++. In the embodiment of FIG. 3, the preliminary software model 230 is generated as a generic Win32 target, which is typically supplied by the Mathworks RTW tool. Generally speaking, the preliminary software model 230, prior to any further processing by embodiments of the present invention, does not allow access to the internal variables, such as block parameters and internal signals, outside the Simulink modeling environment. Alternately, in cases where access to the internal variables is allowed, those variables are accessible only by way of the modeling environment, which also maintains essentially complete control of the execution of the preliminary software model 230.

To allow simultaneous execution control and internal variable access of the model, the steps of the method 300 cause the production of interface software 370 (of FIG. 2) that exposes those internal variables that reside within the preliminary software model 230 outside the original modeling environment. In the embodiment of FIG. 3, C++ wrapper classes 340 that describe the internal variables of the system by way of name and data type, as well as the functions that regulate access to those variables, are generated first (step 310). The use of C++, like other object-oriented languages, allows exposure of some or all of the internal variables in a controlled fashion while preventing access to other aspects of the preliminary software model 230 that a designer would normally desire to remain hidden. While C++ is the language selected for the embodiments disclosed herein, the use of any other language suitable for other applications is also contemplated.

In the embodiment of FIG. 3, the C++ wrapper classes 340 are then used to generate software 350 that, when executed, constructs a Component Object Model (COM) server (step 320). COM is a widely-used software architecture definition specified by Microsoft Corporation that allows software "components," or portions of software, that have been written by separate software developers in a variety of languages to intercommunicate. Basically, the COM architecture eases integration of disparate pieces of software to perform some integrated function by defining a framework governing how those pieces will communicate with each other. One major benefit of utilizing COM technology in the embodiment of FIG. 3 is that the technology is employed across essentially all Win32-based platforms, thus making the task of transferring and executing the resulting software model on such a platform relatively elementary. However, the use of COM technology for other embodiments of the current invention is not required, as other methods allowing access to the internal variables of the preliminary software model 230 may be employed. For example, a more comprehensive interfacing technology, Microsoft® ".NET", which employs a set of Extensible Markup Language (XML) Web services to allow interconnectivity between portions of software, may also be employed. Alternatively, a Win32 console application may be generated directly from the C++ wrapper classes 340 and the preliminary software model 230, thereby generating an executable simulation program generated specifically for that particular system model.

Next, a Dynamic-Link Library (DLL) 360 is built using the preliminary software model 230, the C++ wrapper classes 340, and the COM server construction software 350. Generally speaking, a DLL is a software file that may be linked with an executable program at run-time, instead of at the time the executable program is built. DLLs are commonly used in Win32 systems to provide flexibility in program configurations by allowing decisions concerning which portions of software are to be run by an executable program to be made during the execution of the program. Like COM technology, DLLs are employed extensively by Win32 applications.

The entire process of converting the system model generated within Simulink into the DLL 360 takes place automatically within the RTW environment by way of software scripts that are initiated by the system designer as part of the code generation process. Typically, the designer has a choice of one of several code targets that describe the Simulink-generated system model in software. These targets normally include software written in C, C++, Ada, and various types of embedded targets for various real-time processor architectures. The embodiments of this invention represent yet another choice of target available to the designer, with this target providing the previously unavailable capability of access to the interval variables of the system model by way of a software client residing outside of the original system modeling environment. When this target is chosen, a collection of software scripts are executed within RTW which perform the above-discussed steps for the particular system model. More specifically, according to the embodiment of FIG. 3, a Visual C++ project file is generated, and C++ Visual Studio (also developed by Microsoft®) is called to build the project, resulting in the DLL 360, which will then be asked by the operating system to register itself into the system registry as a COM server. Additionally, other methods of generating the DLL 360 may also be employed.

Once the DLL 360 is built, it may then be transferred to any Win32 computer platform, including those which do not host the Simulink development environment. All of the information required to execute the system model and access internal variables of that model is contained in the DLL 360. Hence, the DLL 360 provides a vast amount of flexibility in terms of the types and number of platforms on which the resulting system model may be simulated.

To utilize the DLL 360, a software client (not shown), or executable program, on the selected platform that links to the DLL 360 is initiated by the system designer. By way of COM technology, the DLL 360 presents a standardized interface definition to which the software client may be designed so that all of the internal variables of the system model are accessible by the client. Typically, the client will have the ability to run simulations on the model, as well as to stop the model periodically so that the designer may view a "snapshot" of the input signals, outputs signals, and internal variables of the system model at a given point. Also, read, and normally write, access to each of these signals and variables, along with any useful identifying information, such as the identity of the block with which each of the signals or variables is associated, may be provided. Additionally, graphical representations of the signals and variables may be supplied to provide the designer another way of analyzing the values captured for each signal and variable.

The software client may take any of a number of forms. For example, the executable program could be a "model browser," which is a special purpose application devised specifically to allow the user access to a software model and its internal variables. The browser typically is a Win32 application that links with the DLL 360, acquiring all of the internal variable and external signal information associated with the model represented by the DLL 360. That information is then accessible via the browser for monitoring and possible modification of those values. The browser would most likely also provide the user with the ability to set initial conditions for the model, start and stop execution of the model, and access both numerical and graphical representation of the various signals and internal variables involved.

Alternately, the software client may be a specific instantiation of a more general purpose program, such as a Microsoft Excel® workbook. Such a program would allow the same type of access to the model and its signals and variables. Different spreadsheets of the workbook could also provide a different view of the operation of the model. For example, one spreadsheet could depict each of the internal variables, their data types and current values. Other sheets may display a graphical representation of specific variables of interest.

Figure 4:
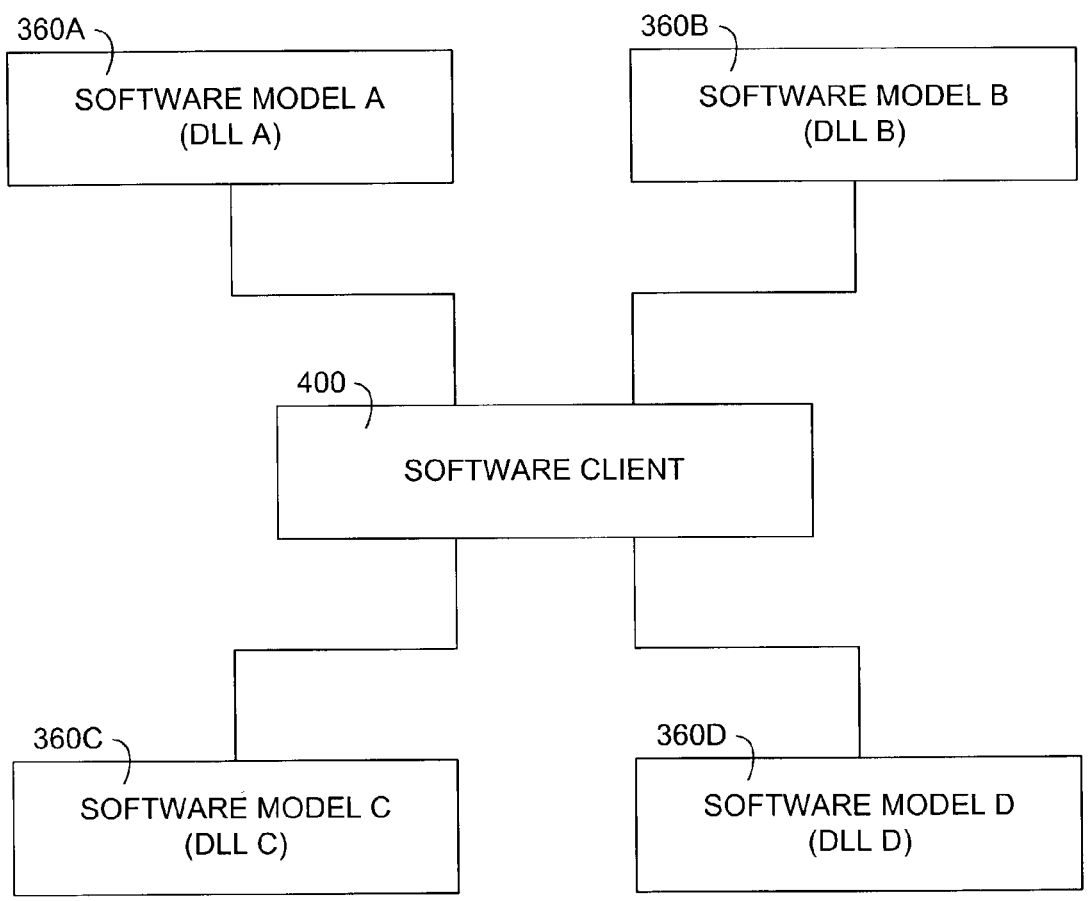
FIG. 4 is a block diagram representing a plurality of disparate software models interacting with each other through a software client.

Regardless of the specific form taken by the software client, a significant potential advantage of embodiments of the invention is the ability of multiple disparate DLLs 360, each possibly representing a portion of a greater software model, to interact with each other by way of the software client. As shown in FIG. 4, a software client 400 controls the execution of four separate DLLs 360A, 360B, 360C, and 360D. Each of the DLLs 360A-D may have been modeled within different modeling environments. Such a circumstance is not uncommon, as system designers may prefer one modeling environment over another for modeling a particular portion of a system. Additionally, the DLLs 360A-D may be executing on separate hardware platforms, each of which may communicate with the software client 400 by way of a communications link. Since the software client 400 can control the execution of each DLL 360A-D, as well as access the internal variables and external signals of each, the software client 400 has the ability to allow the DLLs 360A-D to interact with each other through the software client 400, thus allowing the DLLs 360A-D to interact as a single system while the software client 400 maintains programmatic access to each DLL 360A-D. Therefore, diverse software models, embodied as DLLs 360A-D that are generated according to embodiments of the present invention, may interact with each other while the software client maintains superior analysis capabilities over all of the system by virtue of the client's access to the internal variables of each separate DLL 360A-D.

Another advantage of utilizing multiple DLLs 360A-D is that systems that employ multiple, independent clock domains (in the case of electronic or software-based models) may be more accurately simulated. Such a simulation may be accomplished by organizing the overall system into separate DLLs 360A-D, each of which represents a portion of the overall system that executes within its own autonomous clock domain. The DLLs 360A-D may then be executed on separate hardware platforms, or within the same platform in a multi-tasking fashion. As described above, interaction between the separately-running DLLs 360A-D would then be facilitated by way of the software client 400.

From the foregoing, the embodiments of the invention discussed above have been shown to provide a method of generating a software model of a dynamic system that is executable by way of a software client residing outside the modeling environment in which the original system model was specified. Furthermore, other specific systems and methods embodying the invention are also possible. Therefore, the present invention is not to be limited to the specific forms so described and illustrated; the invention is limited only by the claims.

What is claimed is:

1. A method for generating a software model of a dynamic system, comprising:

generating interface software configured to i) expose at least one internal variable that resides within a preliminary software model of the dynamic system, and ii) expose functions within the preliminary software model that regulate access to the at least one internal variable, the preliminary software model being generated within a modeling environment, and the at least one variable and functions that regulate access to the at least one variable being exposed outside the modeling environment; and generating the software model by way of the preliminary software model and the interface software, the software model containing all information required to execute the software model from outside the modeling environment, and the software model allowing a user access to i) the at least one internal variable, and ii) the functions that regulate access to the at least one internal variable, from outside the modeling environment.

2. The method of claim 1, further comprising the step of generating the preliminary software model prior to generating the interface software.

3. The method of claim 2, further comprising the step of generating a system model prior to generating the preliminary software model, the preliminary software model being based on the system model.

4. The method of claim 1, wherein the software model also allows the user to control execution of the software model from outside the modeling environment.

5. The method of claim 1, wherein generating the interface software further comprises:

generating C++ wrapper classes configured to regulate access to the at least one internal variable; and generating Component Object Model (COM) server construction software configured to construct a COM server that utilizes the C++ wrapper classes to expose the at least one internal variable of the preliminary software model.

6. The method of claim 1, wherein the software model is a Dynamic Link Library (DLL) configured to be executable by a software client.

7. The method of claim 1, wherein the software model is a console application.

8. A computer system including a computer storage medium for generating a software model of a dynamic system, comprising:

means for generating interface software configured to i) expose at least one internal variable that resides within a preliminary software model of the dynamic system, and ii) expose functions within the preliminary software model that regulate access to the at least one internal variable, the preliminary software model being generated within a modeling environment, and the at least one variable and functions that regulate access to the at least one variable being exposed outside the modeling environment; and means for generating the software model by way of the preliminary software model and the interface software, the software model containing all information required to execute the software model from outside the modeling environment, and the software model allowing a user access to i) the at least one internal variable, and ii) the functions that regulate access to the at least one internal variable, from outside the modeling environment.

9. The computer system of claim 8, further comprising means for generating the preliminary software model.

10. The computer system of claim 9, further comprising means for generating a system model prior to generating the preliminary system model, the preliminary software model being based on the system model.

11. The computer system of claim 8, wherein the software model also allows the user to control execution of the software model from outside the modeling environment.

12. The computer system of claim 8, wherein the means for generating the interface software further comprises:

means for generating C++ wrapper classes configured to regulate access to the at least one internal variable; and means for generating Component Object Model (COM) server construction software configured to construct a COM server that utilizes the C++ wrapper classes to expose the at least one internal variable of the preliminary software model.

13. The computer system of claim 8, wherein the software model is a Dynamic Link Library (DLL) configured to be executable by a software client.

14. The computer system of claim 8, wherein the software model is a console application.

15. A program storage medium readable by a computer system, embodying a program executable by the computer system to perform method steps for generating a software model of a dynamic system, the method steps comprising:

generating interface software configured to i) expose at least one internal variable that resides within a preliminary software model of the dynamic system, and ii) expose functions within the preliminary software model that regulate access to the at least one internal variable, the preliminary software model being generated within a modeling environment, and the at least one variable and functions that regulate access to the at least one variable being exposed outside the modeling environment; and generating the software model by way of the preliminary software model and the interface software, the software model containing all information required to execute the software model from outside the modeling environment, and the software model allowing a user access to i) the at least one internal variable, and ii) the functions that regulate access to the at least one internal variable, from outside the modeling environment.

16. The program storage medium of claim 15, the method steps further comprising the step of generating the preliminary software model prior to generating the interface software.

17. The program storage medium of claim 16, the method steps further comprising the step of generating a system model prior to generating the preliminary software model, the preliminary software model being based on the system model.

18. The program storage medium of claim 15, wherein the software model also allows the user to control execution of the software model from outside the modeling environment.

19. The program storage medium of claim 15, wherein generating the interface software further comprises:

generating C++ wrapper classes configured to regulate access to the at least one internal variable; and generating Component Object Model (COM) server construction software configured to construct a COM server that utilizes the C++ wrapper classes to expose the at least one internal variable of the preliminary software model.

20. The program storage medium of claim 15, wherein the software model is a Dynamic Link Library (DLL) configured to be executable by a software client.

21. The program storage medium of claim 15, wherein the software model is a console program.

22. A method for generating a Dynamic Link Library (DLL) representing a software model of a dynamic system, the method comprising:

generating C++ wrapper classes configured to regulate access to at least one internal variable that resides within a preliminary software model of the dynamic system, the preliminary software model being generated within a modeling environment;

generating Component Object Model (COM) server construction software configured to construct a COM server that utilizes the C++ wrapper classes to expose the at least one internal variable of the preliminary software model, and functions within the preliminary software model that regulate access to the at least one internal variable, outside the modeling environment; and building the DLL using the preliminary software model, the C++ wrapper classes, and the COM server construction software, the DLL being executable by a software client outside the modeling environment, the DLL containing all information required to execute outside the modeling environment, and the DLL allowing a user access to the at least one internal variable of the dynamic system by way of the software client.

* * * * *

UNITED STATES PATENT AND TRADEMARK OFFICE
CERTIFICATE OF CORRECTION

PATENT NO. : 7,340,717 B2  Page 1 of 1
APPLICATION NO. : 10/253764
DATED : March 4, 2008
INVENTOR(S) : Allen et al.

It is certified that error appears in the above-identified patent and that said Letters Patent is hereby corrected as shown below:

On the Title page, in Item (56), under "U.S. Patent Documents", in column 1, line 1, 6,762 delete "A" and insert -- A1 --, therefor.

On the Title page, in Item (56), under "U.S. Patent Documents", in column 1, line 2, 79,199 delete "A" and insert -- A1 --, therefor.

On the Title page, in Item (56), under "Other Publications", in column 2, line 1, delete "Operationg" and insert -- Operating --, therefor.

Signed and Sealed this

Fifteenth Day of July, 2008

JON W. DUDAS
*Director of the United States Patent and Trademark Office*